(12) United States Patent
Lee et al.

(10) Patent No.: US 7,683,470 B2
(45) Date of Patent: Mar. 23, 2010

(54) LED PACKAGE

(75) Inventors: Seon Goo Lee, Gyunggi-Do (KR); Hun Joo Hahm, Gyunggi-Do (KR); Dae Yeon Kim, Gyunggi-Do (KR)

(73) Assignee: Samsung Electro-Mechanics Co., Ltd., Gyunggi-Do (KR)

(*) Notice: Subject to any disclaimer, the term of this patent is extended or adjusted under 35 U.S.C. 154(b) by 136 days.

(21) Appl. No.: 11/709,154

(22) Filed: Feb. 22, 2007

(65) Prior Publication Data
US 2007/0176198 A1    Aug. 2, 2007

(30) Foreign Application Priority Data
Feb. 22, 2006    (KR) ........................ 10-2006-0017441

(51) Int. Cl.
*H01L 33/00* (2010.01)
*H01L 21/00* (2006.01)

(52) U.S. Cl. .................. 257/687; 257/E33.072; 257/E23.058; 257/99; 257/100; 257/685; 257/774; 257/668; 257/700; 257/701; 257/786; 257/723; 257/788; 257/787; 257/784

(58) Field of Classification Search ............ 257/99, 257/100, E23.058, E33.072, 700, 701, 786, 257/784, 787, 788, 723, 685, 686
See application file for complete search history.

(56) References Cited

U.S. PATENT DOCUMENTS 6,363,096 B1 * 3/2002 Dodabalapur et al. ......... 372/75

| 6,894,384 | B1 * | 5/2005 | Shizuno ..................... 257/712 |
| 6,949,771 | B2 | 9/2005 | Yoganandan |
| 7,217,999 | B1 * | 5/2007 | Honda ........................ 257/712 |
| 2006/0169991 | A1 * | 8/2006 | Kikuchi ..................... 257/81 |
| 2007/0246715 | A1 * | 10/2007 | Shin et al. .................... 257/79 |
| 2008/0296599 | A1 * | 12/2008 | Mazzochette ............... 257/98 |
| 2009/0003009 | A1 * | 1/2009 | Tessnow et al. ............. 362/487 |

FOREIGN PATENT DOCUMENTS

JP    2002-335019 A    11/2002
JP    2003-31850 A    1/2003

OTHER PUBLICATIONS

Korean Office Action issued in corresponding Korean Patent Application No. 10-2006-0017441, dated on Apr. 30, 2007.

* cited by examiner

*Primary Examiner*—Alexander O Williams
(74) *Attorney, Agent, or Firm*—McDermott Will & Emery LLP

(57) ABSTRACT

A Chip on Board (COB) package which can reduce the manufacturing costs by using a general PCB as a substrate, increase a heat radiation effect from a light source, thereby realizing a high quality light source at low costs, and a manufacturing method thereof. The COB package includes a board-like substrate with a circuit printed on a surface thereof, the substrate having a through hole. The package also includes a light source positioned in the through hole and including a submount and a dome structure made of resin, covering and fixing the light source to the substrate. The invention allows a good heat radiation effect by using the general PCB as the substrate, enabling manufacture of a high quality COB package at low costs. This in turn improves emission efficiency of the light source, ultimately realizing a high quality light source.

2 Claims, 5 Drawing Sheets

LED PACKAGE

CLAIM OF PRIORITY

This application claims the benefit of Korean Patent Application No. 2006-0017441 filed on Feb. 22, 2006, in the Korean Intellectual Property Office, the disclosure of which is incorporated herein by reference.

BACKGROUND OF THE INVENTION

1. Field of the Invention

The present invention relates to a Chip on Board (COB) package used as a light source and, more particularly, to a COB package which uses a general PCB material such as FR4 for a substrate to significantly reduce the manufacturing costs, increases a heat radiation effect from the light source to improve emission efficiency of the light source, thereby obtaining a high quality light source at low costs.

2. Description of the Related Art

A Chip on Board (COB) package, that uses an LED device as a light source for a backlight unit of a TV or a monitor or a backlight for a mobile phone or a Personal Digital Assistant (PDA), is currently developed.

Such a COB package uses an LED device as a light source and has superior capabilities to a Cold Cathode Fluorescent Lamp (CCFL), but has not been put to practical use due to its price.

The CCFL is prone to environmental pollution with use of mercury gas, slow in response, has low color reproducibility and is unsuitable for miniaturization of an LCD panel.

On the other hand, the LED device is environmentally friendly, capable of high speed response in nanoseconds, effective for video signal stream, capable of impulsive driving, and has color reproducibility of 100%. In addition, the LED device is able to change luminance and color temperature by adjusting the light amounts of red, green, blue LED devices and suitable for miniaturization of an LCD panel. Therefore, the LED device has been actively adopted recently as a light source 110 for a backlight of an LCD panel and the like.

As shown in FIG. 1, a conventional COB package 100 includes LED devices as light sources 110 and a Metal Core Printed Circuit Board (MCPCB) 120 having an insulation layer 122 on which the LED devices are mounted. The light sources 110 and the MCPCB 120 account for a large portion of the costs of the COB package 100.

In order to reduce the price of the COB package 100, reduction of the unit cost of each of the LED devices constituting the light sources 110, reduction of the number of LED devices or change of the material of the MCPCB 120 to reduce the unit cost of the MCPCB 120 can be considered.

FIG. 2 illustrates a stepwise method of manufacturing the conventional COB package 100. To manufacture the conventional COB package 100, first, an MCPCB 120 typically made of Al, with an insulation layer 122 formed on a surface thereof is prepared. Then, a metal pattern 124 of Cu and a dielectric layer 126 are formed on the insulation layer 122, thereby forming electrode pads 128.

Then, a die attachment process is conducted in which the LED devices as the light sources 110 are disposed on the MCPCB 120, followed by a wire bonding process in which the light sources 110 and the electrode pads 128 are electrically connected by wires.

Next, a dome structure 140 is formed using epoxy resin or silicone over each of the light source 110 connected by wires 132, thereby fixing each of the light sources 110 to the MCPCB 120.

Although the conventional COB package 100 easily radiates the heat from the light sources 110 via the MCPCB 120 to the outside and thus thermally effective, its fatal disadvantage is the expensive price due to the MCPCB 120.

In order to overcome such a problem, another conventional COB package 200 has been suggested as shown in FIG. 3, disclosed in Japanese Patent Laid-Open Publication Application No. 2002-335019. The COB package 200 includes a substrate 210 having through holes 212 formed therein and support members 220 of metallic material inserted in the through hole 212. Each of the LED devices 230 is seated in each of the support members 220 and bonded to the pad electrodes 232 by wires 234.

In the COB package 200 with such a structure, the support members 220 are made of metal with good thermal conductivity, through which the heat is transferred from the LED devices 230 to the outside, allowing good heat radiation effects.

However, the conventional package has a complex assembly structure in which each of the support members 220 needs to be fixed into each of the through holes 212 of the substrate 210. In particular, the support members 220 should be prepared respectively for the LED devices 230, incurring high manufacturing costs.

SUMMARY OF THE INVENTION

The present invention has been made to solve the foregoing problems of the prior art and therefore an aspect of the present invention is to provide a Chip on Board (COB) package which uses a general PCB material as a substrate and thereby significantly reduces the manufacturing costs, and a manufacturing method thereof.

Another aspect of the invention is to provide a COB package which can be manufactured at low costs, can significantly improve a heat radiation effect of a light source to improve light emission efficiency of the light source, thereby realizing a high quality light source, and a manufacturing method thereof.

According to an aspect of the invention, the invention provides a Chip on Board (COB) package having a light source. The COB package includes: a board-like substrate with a circuit printed on a face thereof, the substrate having a through hole formed therein; a light source disposed in the through hole and including a submount; and a dome structure made of resin for covering and fixing the light source to the board.

Preferably, the through hole has a reflecting surface formed therein.

Preferably, the submount of the light source is adapted to closely contact a chassis on which the substrate is mounted.

According to another aspect of the invention, the invention provides a method of fabricating a Chip on Board (COB) package having a light source. The method includes: providing a board-like substrate with a circuit printed on a face thereof; forming a through hole in the substrate; attaching a tape on an undersurface of the substrate; mounting a light source on the tape in a position corresponding to the location of the through hole; forming a dome structure with resin to fix the light source to the substrate; and removing the tape.

Preferably, the step of forming a through hole in the substrate includes: plating a Cu layer in the through hole; patterning the substrate; forming a solder resist pattern on the substrate; and forming a reflecting surface on the Cu layer of the through hole.

Preferably, the step of mounting a light source on the tape in a position corresponding to the location of the through hole includes attaching the submount of the light source on the tape.

Preferably, the step of mounting a light source on the tape in a position corresponding to the location of the through hole includes wire bonding to electrically connect the light source with a pad electrode of the board.

Preferably, the step of removing the tape includes mounting the submount of the light source in surface contact with a chassis.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
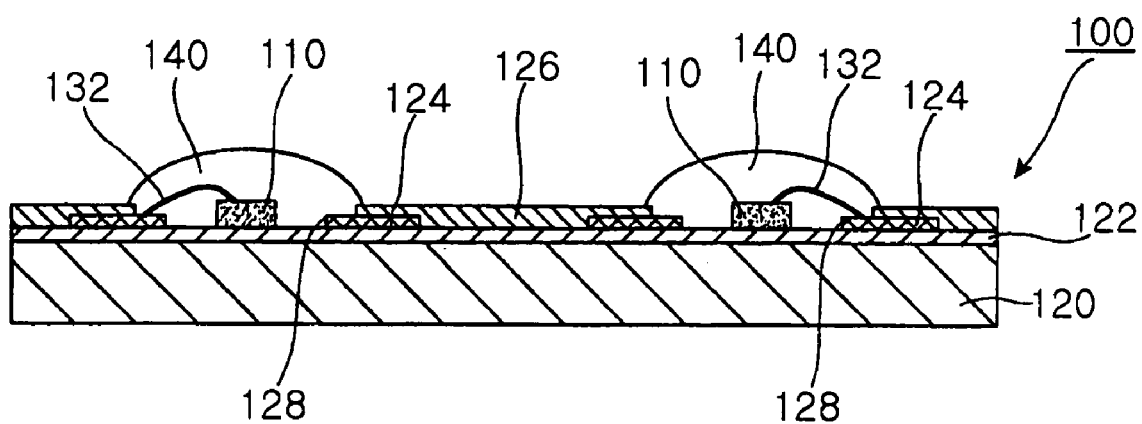
FIG. 1 is a sectional view illustrating a Chip on Board (COB) package using a Metal Core Printed Circuit Board (MCPCB) according to the prior art.
Figure 2:
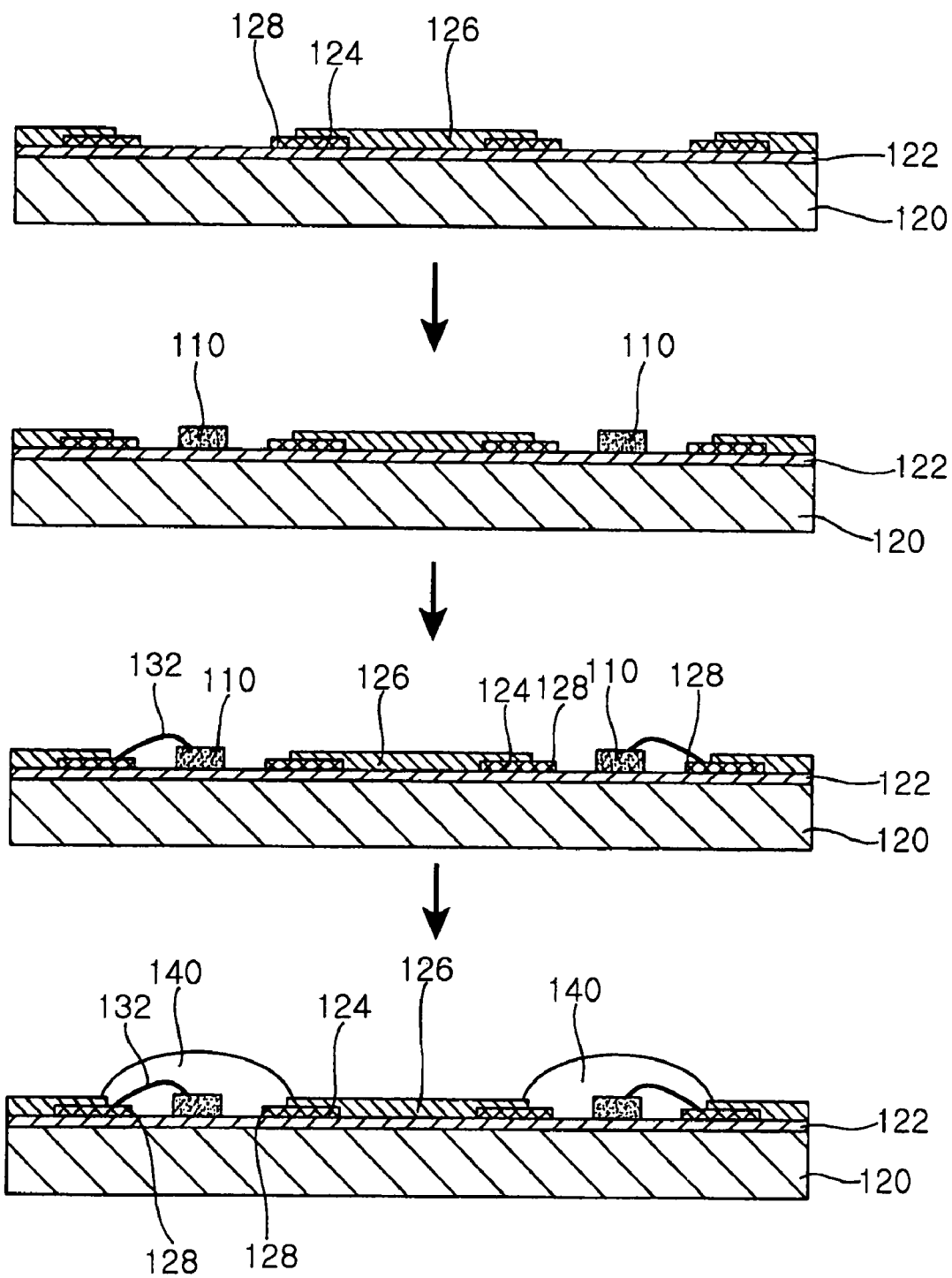
FIG. 2 is a view illustrating a stepwise process of fabricating the COB package using the MCPCB according to the prior art.
Figure 3:
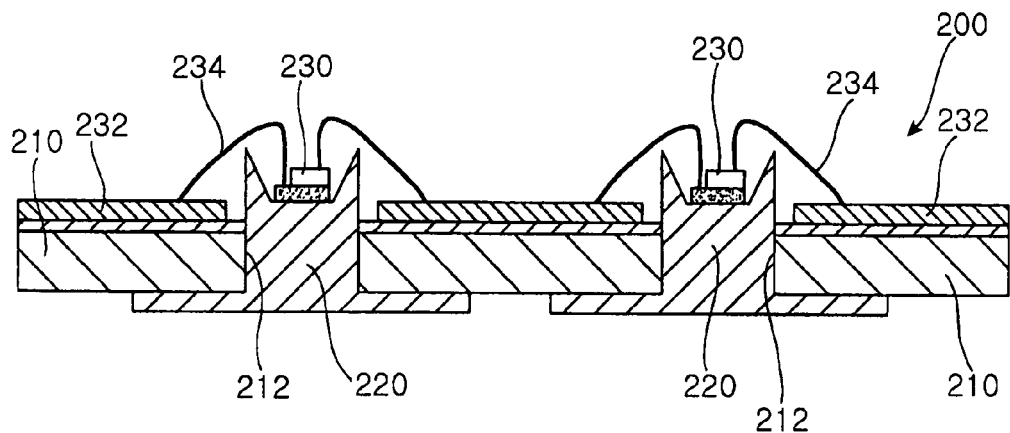
FIG. 3 is a sectional view illustrating another COB package according to the prior art.
Figure 4:
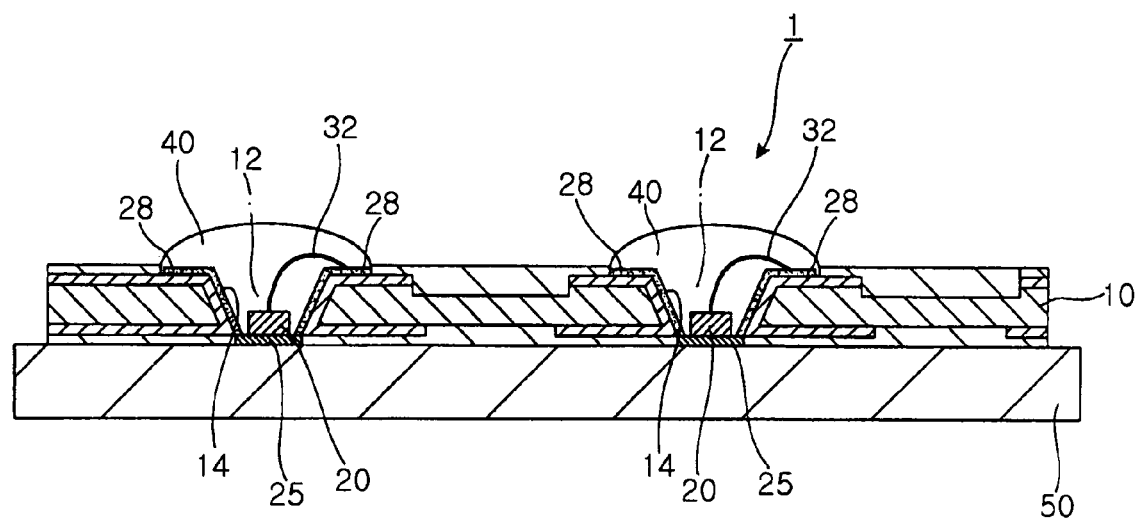
FIG. 4 is a sectional view illustrating a COB package using a general PCB material according to the present invention.

A Chip on Board (COB) package 1 according to the present invention has a substrate 10 made of a general PCB as shown in FIG. 4.

The general PCB is of a typical FR4 material with Cu layers formed on upper and lower surfaces thereof, and commercially available at a very low cost compared to the MCPCB 120.

In addition, the COB package 1 according to the present invention has through holes 12 formed in the substrate 10. Each of the through holes 12 penetrates through the substrate 10 and has a reflecting surface 14 formed therein by Ag or Au plating.

In addition, the COB package 1 according to the present invention has light sources 20 each including a submount 25 fitted to the bottom of the through hole 12, and the light sources 20 are composed of LED devices.

The submounts 25 can be made of generally used Si or AlN. An upper surface of each of the submounts 25, on which the LED device is placed, has reflective coating applied thereon to improve light extraction efficiency.

In addition, each of the light sources 20 includes wires 32 electrically connected to the pad electrode 28 formed on the substrate 10.

Further, the COB package 1 according to the present invention includes a dome structure 40 made of resin, covering and fixing the light source 20 to the substrate 10.

The dome structure 40 is made of epoxy resin or silicone, fixing each of the light sources 20 and the submounts 25 to the substrate 10.

Therefore, the dome structure 40 should have sufficient strength for supporting the light sources 20 and the submounts 25 on the board 10.

In this configuration, each of the submounts 25 of the light sources 20 is in close contact with a chassis 50. This in turn allows the heat generated from the light source 20 to be transferred via the submount 25 to the chassis 50 of metallic material, significantly improving heat radiation efficiency.

Figure 5A:
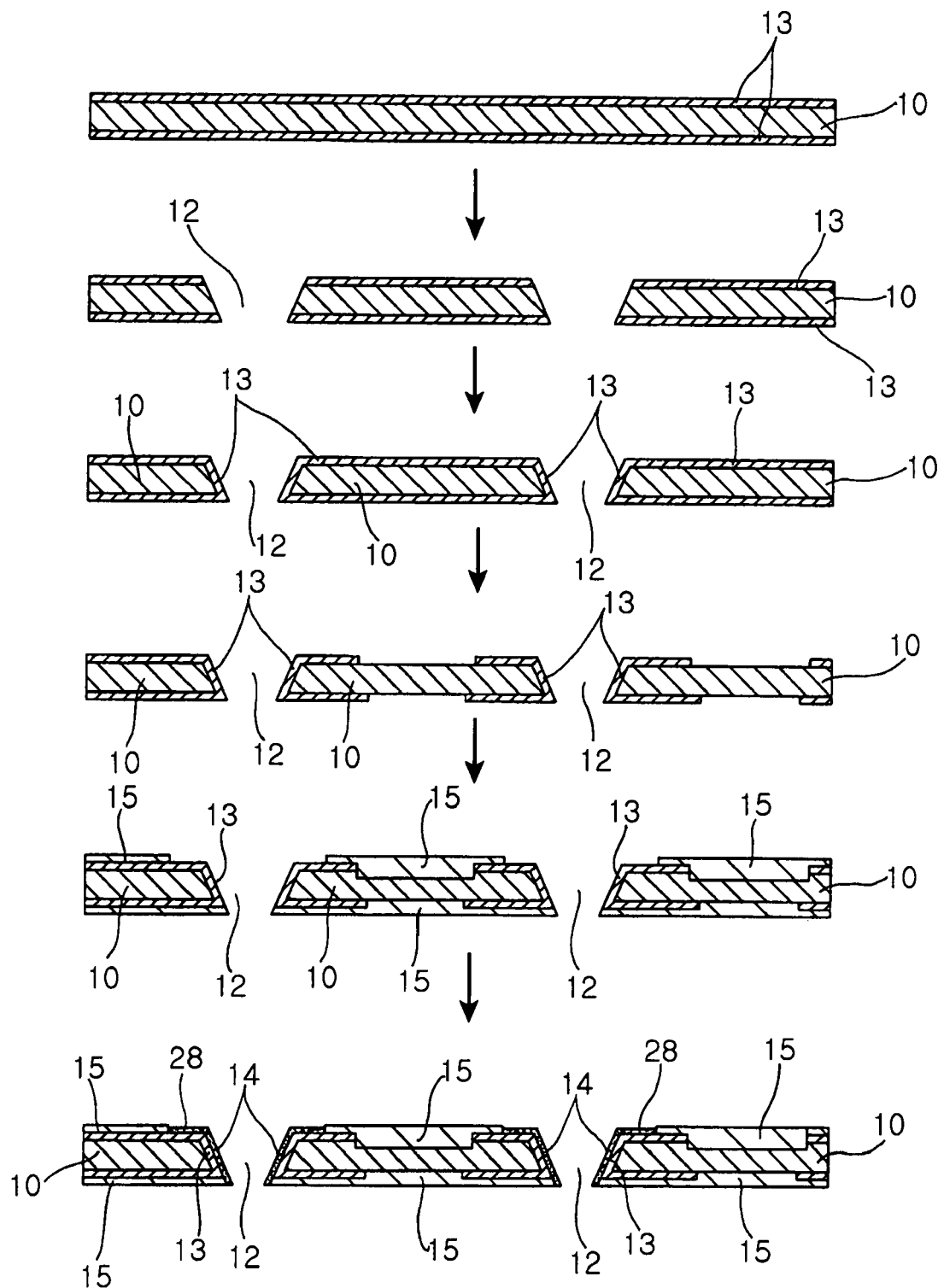
FIG. 5 is a view illustrating a manufacturing method of the COB package using a general PCB material according to the present invention, in which (a) illustrates a step of forming a through hole in a general PCB and a reflecting surface in the through hole, and (b) illustrates a step of mounting a light source on the general PCB, forming a dome structure and mounting a resultant structure on a chassis.
Figure 5B:
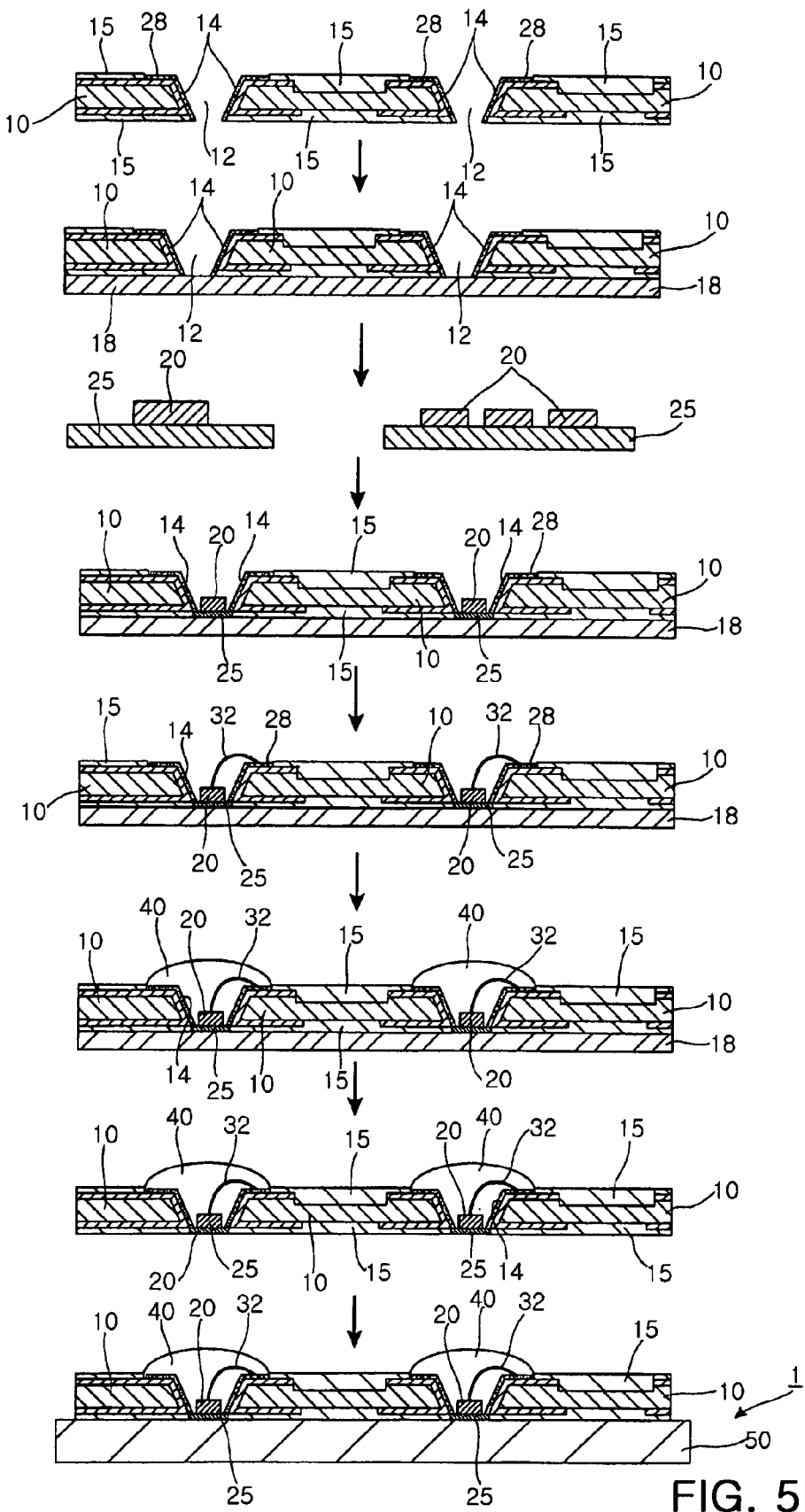

FIG. 5 illustrates an overall manufacturing method of the COB package 1 according to the present invention.

The manufacturing method of the COB package according to the present invention starts with providing a substrate 10 made of a general PCB.

The substrate 10 is typically made of FR4 and has Cu layers 13 formed on upper and lower surfaces thereof.

Then, the through holes 12 are formed in the substrate 10.

As shown in FIG. 5(a), the step of forming the through holes 12 in the substrate 10 includes plating a Cu layer 13 in each of the through holes 12.

The Cu layer 13 is plated in each of the through holes 12 formed by a drill (not shown). This entails forming a seed layer by electroless copper plating in each of the through holes 12, followed by stably forming the Cu layer 13 in each of the through holes 12 by electrolyte copper plating.

Then, the substrate 10 is patterned. This patterning step includes etching the Cu layer 13 formed on the substrate 10 to form a desired wire pattern on the substrate 10.

In addition, the patterning step includes forming a solder resist pattern 15 on the substrate 10 and forming a reflecting surface 14 of Ag or Au plating on the Cu layer 13 of the through hole 12.

That is, in order to form the reflecting surface 14 in the through hole 10, the solder resists 15 are attached on portions on the substrate 10 where Ag or Au plating is not required and then Ag or Au is plated in the through hole 12.

In addition, the manufacturing method of the COB package 1 according to the present invention includes attaching a tape 18 on an undersurface of the substrate 10.

The tape 18 is attached on an undersurface of the substrate 10 which has a plurality of through holes 12 formed therein. In the case of forming a dome structure 40, described later, on the substrate 10, the tape 18 functions to contain the liquid-state dome structure 40 in the through hole 12 of the substrate 10 so that the dome structure 40 is cured from the liquid state to a solid state.

In addition, the method according to the present invention includes attaching light sources on the tape 18 in positions corresponding to the locations of the through holes 12 of the substrate 10.

The step of attaching the light sources 20 on the tape 18 in positions corresponding to the locations of the through holes 12 of the substrate includes attaching the submounts 25 of the light sources 20 on the tape 18.

The submounts 25 can be made of generally used Si or AlN, and each of the submounts 25 has one or a plurality of light sources 20 placed thereon. An upper surface of each of the submounts 25 on which the LED device is placed, has reflective coating applied thereon to improve light extraction efficiency.

The LED devices constituting the light sources 20 can be composed of red, green and blue LED devices to emit white light.

In addition, according to the present invention, the step of attaching the light sources 20 on the tape 18 in positions 12 corresponding to the locations of the through holes 12 of the substrate preferably includes wire bonding to electrically connect each of the light sources 20 with each of the pad electrodes 28 of the substrate 10. Through this bonding by the wires 32, each of the LED devices constituting the light source 20 is electrically connected to the wire pattern of the substrate, respectively.

In addition, the method according to the present invention includes forming dome structures 40 made of resin to fix the light sources 20 to the substrate 10.

Each of the dome structures 40 is made of epoxy resin or silicone and functions to fix each of the light sources 20 and the submounts 25 to the substrate 10.

Each of the dome structure 40 is injected over each of the light sources placed over the tape 18 and cured into a solid state by heat or ultraviolet rays. In the case of being cured into a solid state, the dome structure 40 needs to have sufficient strength for supporting the light source 20 and the submount 25 on the substrate 10.

In addition, the method according to the present invention includes removing the tape 18 after fixing the light sources 20 and the submounts 25 to the substrate 10.

In this step, the tape 18 is removed from the undersurfaces of the substrate 10 and the submounts 26, thereby exposing the submounts 26.

In addition, the step of removing the tape 18 in the method according to the present invention further includes mounting the submounts 25 of the light sources 20 in surface contact with a chassis 50.

Therefore, as described above, the heat generated from the light sources 20 is transferred via the submounts 25 to the chassis 50 of metallic material, significantly improving the heat radiation efficiency.

According to the present invention as set forth above, a COB package adopts a substrate of a general PCB material such as FR4 instead of a metallic substrate and LED devices constituting light sources placed in direct contact with a metallic chassis via submounts. This improves heat radiation efficiency and allows the manufacture of a high quality COB package at low costs.

In addition, the enhanced heat radiation effect from the light sources significantly increases the emission efficiency of the light sources, thereby realizing a high quality light source.

Moreover, the package includes reflecting surfaces formed in the through holes of the substrate made of FR4 as well as on upper surfaces of the submounts, further improving the emission efficiency of the light sources.

While the present invention has been shown and described in connection with the exemplary embodiments, it will be apparent to those skilled in the art that modifications and variations can be made without departing from the spirit and scope of the invention as defined by the appended claims.

What is claimed is:

1. A LED package with a light source mounted thereon, the LED package comprising:
    a board-like substrate with a circuit printed on a face thereof, the substrate having a through hole formed therein;
    a light source disposed in the hole, the light source including an LED device and a submount fitted to the bottom of the interior of the through hole, wherein the upper surface of the submount on which the LED device is placed, has a reflective coating applied thereon; and
    a dome structure made of resin for covering and fixing the light source to the boar,
    wherein the submount is exposed to a bottom surface of the substrate via the through hole and the bottom surface of the submount is coplanar with the bottom surface of the substrate, such that the submount of the light source is adapted to closely contact a chassis on which the substrate is mounted.

2. The LED package according to claim 1, wherein the through hole has a reflecting surface formed therein.

* * * * *